(12) United States Patent
Min et al.

(10) Patent No.: US 8,193,842 B2
(45) Date of Patent: Jun. 5, 2012

(54) FREQUENCY SYNTHESIZER

(75) Inventors: Byung Hun Min, Gunsan (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/344,513

(22) Filed: Jan. 5, 2012

(65) Prior Publication Data

US 2012/0105116 A1 May 3, 2012

Related U.S. Application Data

(62) Division of application No. 12/626,554, filed on Nov. 25, 2009, now Pat. No. 8,115,525.

(30) Foreign Application Priority Data

| Dec. 2, 2008 | (KR) | 10-2008-0121253 |
| Jul. 8, 2009 | (KR) | 10-2009-0062191 |

(51) Int. Cl.
*H03L 7/06* (2006.01)
(52) U.S. Cl. ............................... 327/156; 327/147
(58) Field of Classification Search .............. 327/147, 327/156
See application file for complete search history.

(56) References Cited

U.S. PATENT DOCUMENTS

| 6,326,851 | B1 | 12/2001 | Staszewski et al. | |
| 7,859,344 | B2 * | 12/2010 | Uozumi et al. | 331/1 A |
| 7,917,319 | B2 * | 3/2011 | Hafed | 702/69 |
| 8,050,376 | B2 * | 11/2011 | Liu et al. | 375/376 |
| 2001/0033200 | A1 | 10/2001 | Staszewski et al. | |
| 2009/0198461 | A1 * | 8/2009 | Hafed | 702/69 |
| 2011/0096930 | A1 * | 4/2011 | Walmsley | 380/278 |
| 2011/0161755 | A1 * | 6/2011 | Hafed | 714/724 |

FOREIGN PATENT DOCUMENTS

KR 1020060002110 A 1/2006

OTHER PUBLICATIONS

Hsiang-Hui Chang et al., "A Fractional Spur-Free ADPLL with Loop-Gain Calibration and Phase-Noise Cancellation for GSM/GPRS/EDGE", 2008 IEEE International Solid State Circuits Conference, ISSCC 2008 / Session 10 / Cellular Tranceivers / 10.1, Feb. 2008, pp. 200-201, 606.

Chun-Ming Hsu et al., "A Low-Noise, Wide-BW 3.6GHz Digital ΔΣ Fractional-N Frequency Synthesizer with a Noise-Shaping Time-to-Digital Converter and Quantization Noise Cancellation", 2008 IEEE International Solid-State Circuits Conference, ISSCC 2008 / Session 19 / PLLs & Oscillators / 19.1, Feb. 2008, pp. 340-341, 617.

* cited by examiner

*Primary Examiner* — Lincoln Donovan
*Assistant Examiner* — Adam Houston

(57) ABSTRACT

There is provided a frequency synthesizer. The frequency synthesizer includes a frequency oscillator adjusting an output frequency according to a control bit; a programmable divider having a preset minimum division ratio, the programming divider dividing the output frequency of the frequency oscillator at a variable division ratio; a counter unit receiving an output signal of the programmable divider and a reference frequency to generate a count value by counting rising edges of the output signal of the programmable divider during one cycle of the reference frequency, and outputting a first hit signal when the count value is 1, and outputting a second hit signal when the count value is 2; and a phase detection unit outputting a control bit obtained by subtracting a fractional error of the output signal of the programmable divider from a fractional error at a locked phase obtained from the count value and the reference frequency.

7 Claims, 5 Drawing Sheets

FREQUENCY SYNTHESIZER

CROSS-REFERENCE TO RELATED APPLICATIONS

This application claims the priority of Korean Patent Application Nos. 10-2008-0121253 filed on Dec. 2, 2008, and 10-2009-0062191 filed on Jul. 8, 2009 in the Korean Intellectual Property Office, the disclosures of which are incorporated herein by reference.

BACKGROUND OF THE INVENTION

1. Field of the Invention

The present invention relates to a frequency synthesizer, and more particularly, to a frequency synthesizer capable of reducing a lock time by lowering a frequency of a frequency oscillator with the use of a divider and configuring a phase locked loop (PLL) with a digital block.

2. Description of the Related Art

In the fields of mobile communications, frequency synthesizers are widely used to generate stable frequencies for data transmission and reception. Frequency oscillators may include a phase locked loop (PLL) and a voltage controlled oscillator (VCO). The PLL may lock an output frequency of the VCO in a negative feedback control scheme.

Digital frequency oscillators for wideband tuning according to the related art have used an adaptive frequency correction loop. The frequency correction loop may include a VCO, a main divider, a frequency detector, and a state machine. An output frequency of the VCO is controlled by an input bit value. The output frequency of the VCO linearly increases with an increase of a digital control bit value B[k]. The main divider generates a division signal by dividing an oscillation frequency waveform outputted from the VCO. The frequency detector is configured with a counter, and calculates a difference in clock numbers between the division frequency and a reference frequency during n clocks of the reference frequency. The state machine receives the difference of number of clocks from the frequency detector during n clocks of the reference frequency, determines a frequency state between the reference frequency and the division frequency, and readjusts the output bit value. By repeating those procedures, the output frequency of the VCO is shifted to a frequency corresponding to a multiplication of the division value of the main divider and the reference frequency.

However, since the frequency correction loop readjusts the VCO input bits by simply detecting the state of the frequency difference through the state machine, it takes a long time to shift to a desired frequency band when the input bit for the frequency correction of the VCO is large.

SUMMARY OF THE INVENTION

An aspect of the present invention provides a frequency synthesizer capable of reducing a lock time by lowering a frequency of a frequency oscillator with the use of a divider and configuring a phase locked loop (PLL) with a digital block.

An aspect of the present invention also provides a frequency synthesizer including: a frequency oscillator adjusting an output frequency according to a control bit; a programmable divider in which a minimum division ratio (n, where n is a constant) is previously set, the programming divider dividing the output frequency of the frequency oscillator at a variable division ratio; a counter unit receiving an output signal of the programmable divider and a reference frequency to generate a count value by counting rising edges of the output signal of the programmable divider during one cycle of the reference frequency, and outputting a first hit signal when the count value is 1, and outputting a second hit signal when the count value is 2; and a phase detection unit outputting a control bit obtained by subtracting a fractional error of the output 2n signal of the programmable divider from a fractional error at a locked phase obtained from the count value and the reference frequency.

The phase detection unit may include: a time-to-digital converter converting a phase difference between the reference frequency and the first hit signal into a first digital bit, and converting a phase difference between the first hit signal and the second hit signal into a second digital bit; an error normalization block outputting a value obtained when the first digital bit is divided by the second digital bit; and a phase detector outputting the control bit obtained when an output value of the error normalization block is subtracted from the fractional error at the locked phase obtained from the count value and the reference frequency.

The control bit ($\phi_P[K]$) outputted from the phase detector my be expressed as:

$$p\cdot f = FCW/n, \mod_c = c/n, \Phi_P[K] = (\Sigma(p\cdot f - (cnk[K] + \mod_c))) - \Phi_{PN}[K]$$

where FCW is a frequency channel word, n is the minimum division ratio, p·f is a reference comparison value (where p is an integer value, and f is a fractional value), c is a remainder value when the p is divided by the n, cnk[K] is the count value obtained by counting rising edges of the output signal of the programmable divider during one cycle of the reference frequency, and $\phi_{PN}[K]$ is the output value of the error normalization block.

The frequency synthesizer may further include a loop filter connected between the phase detection unit and the frequency oscillator to output an average value of the outputs of the phase detection unit to the frequency oscillator.

The programmable divider may divide the output signal of the frequency oscillator (the reference comparison value −1) times at the minimum division ratio, and divide the output signal of the frequency oscillator one more time by the sum of the minimum division ratio and the integer value of the remainder obtained when the FCW command value is divided by the minimum division ratio, the FCW command value being a bit value inputted in order to obtain a desired output frequency.

The counter unit may include: a flip-flop receiving the reference frequency and the output signal of the programmable divider; a counter receiving an output signal of the flip-flop as a reset signal, and the output signal of the programmable divider as a clock signal; and a latch receiving the count value outputted from the counter and the reference frequency to output number of clocks.

According to another aspect of the present invention, there is provided a frequency synthesizer including: a frequency oscillator adjusting an output frequency according to a control bit; a programmable divider in which a minimum division ratio (n, where n is a constant) is previously set, the programming divider dividing the output frequency of the frequency oscillator at a variable division ratio; a counter unit receiving an output signal of the programmable divider and a reference frequency to generate a count value by counting rising edges of the output signal of the programmable divider during one cycle of the reference frequency, and outputting a first hit signal when the count value is 1, and outputting a second hit signal when the count value is 2; a frequency detector outputting a first control bit obtained by subtracting the count value of the counter unit from an integer value of a value obtained when a frequency channel word (FCW) command value is divided by the minimum division ratio, the FCW command value being a bit value inputted in order to obtain a desired output frequency; a phase detection unit outputting a second control bit obtained by subtracting a fractional error of the output signal of the programmable divider from a fractional error at a locked phase obtained from the count value and the reference frequency; a mode change block connected to the frequency detector and the phase detection unit to selectively output the first control bit or the second control bit; and a loop filter unit connected between the mode change block and the frequency oscillator.

The phase detection unit may include: a time-to-digital converter converting a phase difference between the reference frequency and the first hit signal into a first digital bit, and converting a phase difference between the first hit signal and the second hit signal into a second digital bit; an error normalization block outputting a value obtained when the first digital bit is divided by the second digital bit; and a phase detector outputting the control bit obtained when an output value of the error normalization block is subtracted from the fractional error at the locked phase obtained from the count value and the reference frequency.

The control bit ($\phi_P[K]$) outputted from the phase detector may be expressed as:

$$p \cdot f = FCW/n, \text{mod}_c = c/n, \Phi_P[K] = (\Sigma(p \cdot f - (cnk[K] + \text{mod}_c))) - \Phi_{PN}[K]$$

where FCW is a frequency channel word, n is the minimum division ratio, p·f is a reference comparison value (where p is an integer value, and f is a fractional value), c is a remainder value when the p is divided by the n, cnk[K] is the count value obtained by counting rising edges of the output signal of the programmable divider during one cycle of the reference frequency, and $\phi_{PN}[K]$ is the output value of the error normalization block.

The mode change block may count number of successive 0s in the frequency detector output value in synchronization with reference frequency clocks, and change a connection of the frequency detector and the loop filter unit to a connection of the phase detection unit and the loop filter unit when the count value is equal to a preset value, the preset value being a value obtained by multiplying the reference frequency (f_ref) by the minimum division ratio (n) and dividing a resulting value by an allowable error frequency ($\Delta f$) at which the phase locked loop is lockable.

The programmable divider may divide the output signal of the frequency oscillator (the reference comparison value −1) times at the minimum division ratio, and divide the output signal of the frequency oscillator one more time by the sum of the minimum division ratio and the integer value of the remainder obtained when the FCW command value is divided by the minimum division ratio, the FCW command value being a bit value inputted in order to obtain a desired output frequency.

The counter unit may include: a flip-flop receiving the reference frequency and the output signal of the programmable divider; a counter receiving an output signal of the flip-flop as a reset signal, and the output signal of the programmable divider as a clock signal; and a latch receiving the count value outputted from the counter and the reference frequency to output number of clocks.

The loop filter unit may include: a first loop filter averaging first control bit values outputted from the frequency detector; and a second loop filter averaging second control bit values outputted from the phase detection unit.

According to another aspect of the present invention, there is provided a frequency synthesizer including: a frequency oscillator adjusting an output frequency according to a control bit; a pre-divider dividing the output frequency of the frequency oscillator at a preset division ratio (n, where n is a constant); a counter unit receiving an output signal of the pre-divider and a reference frequency to generate a count value by counting rising edges of the output signal of the pre-divider during one cycle of the reference frequency, and outputting a first hit signal when the count value is 1, and outputting a second hit signal when the count value is 2; a frequency detector outputting a first control bit obtained by subtracting the count value of the counter unit from an integer value of a value obtained when a frequency channel word (FCW) command value is divided by the minimum division ratio, the FCW command value being a bit value inputted in order to obtain a desired output frequency; a phase detection unit outputting a second control bit obtained by subtracting a fractional error of the output signal of the pre-divider from a fractional error at a locked phase obtained from the count value and the reference frequency; a mode change block connected to the frequency detector and the phase detection unit to selectively output the first control bit or the second control bit; and a loop filter unit connected between the mode change block and the frequency oscillator.

The phase detection unit may include: a time-to-digital converter converting a phase difference between the reference frequency and the first hit signal into a first digital bit, and converting a phase difference between the first hit signal and the second hit signal into a second digital bit; an error normalization block outputting a value obtained when the first digital bit is divided by the second digital bit; and a phase detector outputting the control bit obtained when an output value of the error normalization block is subtracted from the fractional error at the locked phase obtained from the count value and the reference frequency.

The control bit ($\phi_P[K]$) outputted from the phase detector may be expressed as:

$$p \cdot f = FCW/n, \text{mod}_c = c/n, \Phi_P[K] = (\Sigma(p \cdot f - (cnk[K] + \text{mod}_c))) - \Phi_{PN}[K]$$

where FCW is a frequency channel word, n is the minimum division ratio, p·f is a reference comparison value (where p is an integer value, and f is a fractional value), c is a remainder value when the p is divided by the n, cnk[K] is the count value obtained by counting rising edges of the output signal of the programmable divider during one cycle of the reference frequency, and $\phi_{PN}[K]$ is the output value of the error normalization block.

The mode change block may count number of successive 0s in the frequency detector output value in synchronization with reference frequency clocks, and change a connection of the frequency detector and the loop filter unit to a connection of the phase detection unit and the loop filter unit when the count value is equal to a preset value, the preset value being a value obtained by multiplying the reference frequency (f_ref) by the minimum division ratio (n) and dividing a resulting value by an allowable error frequency ($\Delta f$) at which the phase locked loop is lockable.

The counter unit may include: a flip-flop receiving the reference frequency and the output signal of the pre-divider; a counter receiving an output signal of the flip-flop as a reset signal, and the output signal of the pre-divider as a clock signal; and a latch receiving the count value outputted from the counter and the reference frequency to output number of clocks.

The loop filter unit may include: a first loop filter averaging first control bit values outputted from the frequency detector; and a second loop filter averaging second control bit values outputted from the phase detection unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
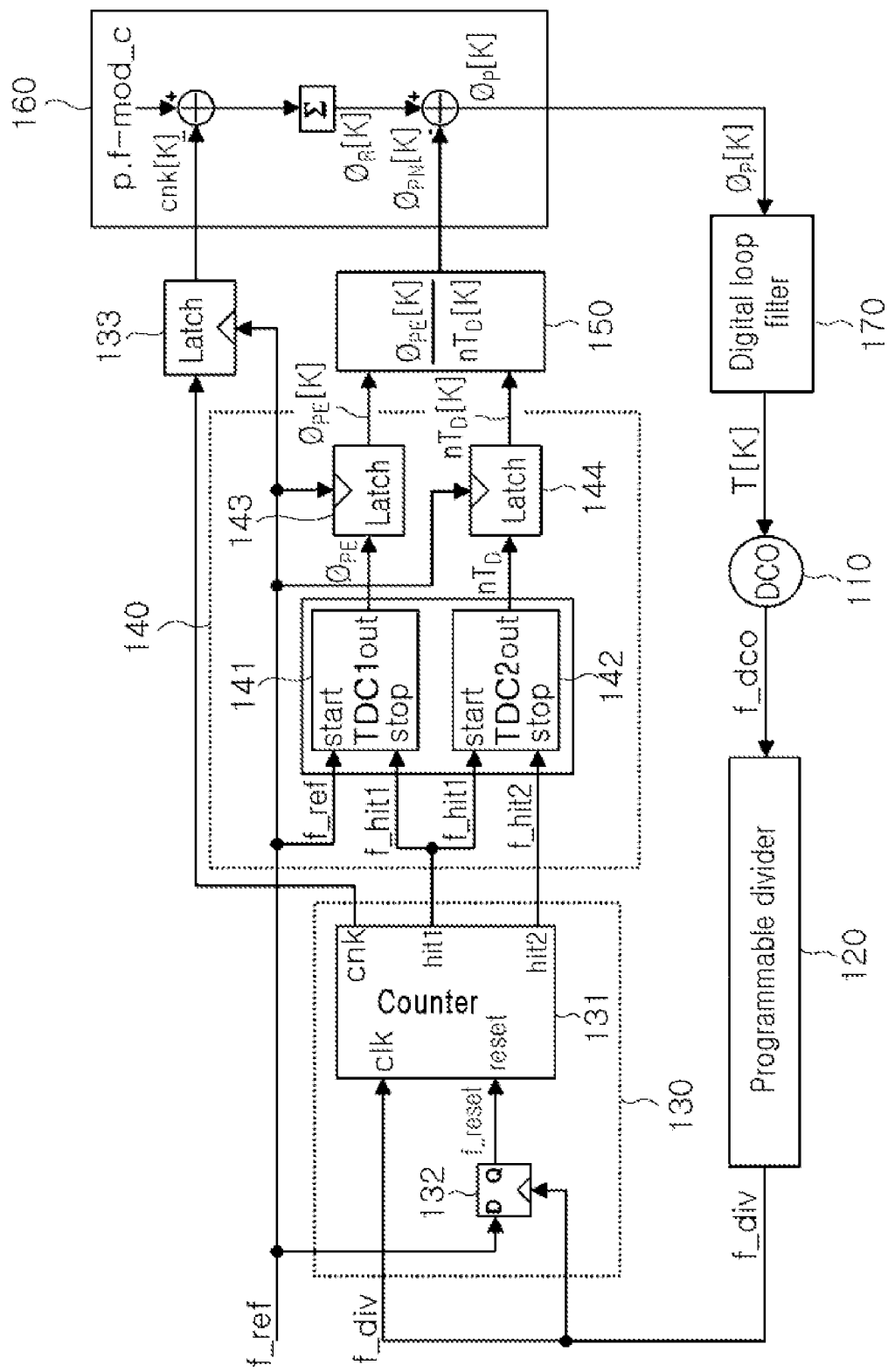
FIG. 1 is a configuration diagram of a frequency synthesizer according to an embodiment of the present invention.

Exemplary embodiments of the present invention will now be described in detail with reference to the accompanying drawings. The invention may; however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

FIG. 1 is a configuration diagram of a frequency synthesizer according to an embodiment of the present invention.

Referring to FIG. 1, a frequency synthesizer according to an embodiment of the present invention may include a frequency oscillator 110, a programmable divider 120, a counter unit 130, a time-to-digital converter 140, an error normalization block 150, and a phase detector 160.

In the frequency synthesizer according to this embodiment of the present invention, a frequency channel word (FCW) command value and a minimum division ratio n (where n is a constant) of the programmable divider 120 may be previously set. The FCW command value is inputted for obtaining a desired output frequency at the frequency oscillator 110.

The frequency oscillator 110 may be a voltage controlled oscillator (VCO) or a digitally controlled oscillator (DCO). In this embodiment, the frequency oscillator 110 may be configured with the DCO. The DCO 110 may adjust an output frequency according to an input control bit. The output frequency of the DCO 110 may be fed back through the programmable divider 120, the counter unit 130, the time-to-digital converter 140, and the phase detector 160, and again control the DCO 110. In this way, a phase locked loop (PLL) may be configured in the frequency synthesizer.

The programmable divider 120 may divide the output frequency f_dco of the DCO 110. In this embodiment, the programmable divider 120 may have a preset minimum division ratio n to a division ratio of 2n−1, and may divide the output frequency of the DCO 110 at a division ratio selected among the division ratios n to 2n−1.

The FCW command value may have an integer part and a fractional part. In this embodiment, it is assumed that the FCW command value has an integer part alone.

When the PLL of the frequency synthesizer is in a locked state, that is, the output frequency of the DCO 110 is in a constant state, the division in the programmable divider 120 may be expressed as:

$$W = n(p-1) + (n+c)$$

where W represents the preset FCW command value, n represents the preset minimum division ratio of the programmable divider, and c represents the remainder when the FCW command value W is divided by the minimum division ratio n.

Using the above equation, a reference comparison value p used as a reference in the frequency detector may be calculated.

Therefore, when assuming that the frequency correction loop of the frequency synthesizer is in a locked state, the programmable divider 120 may divide the output frequency f_dco of the DCO p−1 times at the division ratio of n, and divide it one time at the division ratio of n+c. Thus, the value "p" may represent how many times the output signal of the frequency oscillator 110 is divided in the programmable divider 120.

The counter unit 130 may receive the output signal f_div of the programmable divider 120 and the reference frequency f_ref, and output a count value cnk[K] by counting rising edges of the output signal f_div of the programmable divider 120 during one cycle of the reference frequency f_ref. In addition, the counter unit 130 may output a first hit signal f_hit1 of a high state when the count value is 1, and output a second hit signal f_hit2 of a high state when the count value is 2.

In this embodiment, the counter unit 130 may include a flip-flop 132, a counter 131, and a latch 133. The flip-flop 132 receives the reference frequency f_ref and the output signal f_div of the programmable divider 120. The counter 131 receives an output signal of the flip-flop 132 as a counter reset signal, and the output signal f_div of the programmable divider 120 as a clock signal. The latch 133 may receive an output of the counter 131 and the reference frequency f_ref to output the number of clocks.

The flip-flop 132 may receive the reference frequency f_ref and the output signal f_div of the programmable divider, and output a counter reset signal f_reset so that it is re-timed.

The counter 131 may be an up-counter. The counter 131 may be reset when the counter reset signal f_reset changes from 0 to 1 (low-to-high transition), and count the number of clocks of the division signal f_div inputted during one cycle of the counter reset signal f_reset until a next reset.

The count value of the counter 131 is the number of clocks of the signal f_div outputted from the programmable divider 120 during one cycle of the reference frequency f_ref. The count value of the counter 131 may be inputted to the phase detector 160 through the latch 133.

The time-to-digital converter 140 may receive the reference frequency f_ref, the first hit signal f_hit1, and the second hit signal f_hit2, convert a phase difference $\phi_{PE}$ between the reference frequency f_ref and the first hit signal f_hit1 into a first digital bit $\phi_{PE}[K]$, and convert a phase difference $nT_D$ between the first hit signal f_hit1 and the second hit signal f_hit2 into a second digital bit $nT_D[K]$.

The error normalization block 150 may receive the first digital bit $\phi_{PE}[K]$ and the second digital bit $nT_D[K]$ from the time-to-digital converter 140, and output a value obtained by dividing the first digital bit $\phi_{PE}[K]$ by the second digital bit $nT_D[K]$.

The phase detector 160 may receive the count value cnk[K] and the output value of the error normalization block 150 to output a control bit $\phi_P[K]$.

In this embodiment, the control bit $\phi_P[K]$ outputted from the phase detector 160 may be expressed as:

$$\phi_P[K] = (\Sigma(p \cdot f - (cnk[K] + \mathrm{mod\_}c))) - \phi_{PN}[K])$$

where p·f is a reference comparison value obtained by dividing the FCW command value by the minimum division ratio n (where p is an integer value, and f is a fractional value), mod_c is a value obtained by dividing a value c by the minimum division ration, wherein the value c is an integer value of the remainder when the FCW command value is divided by the minimum division ratio, cnk[K] is the count value obtained by counting the rising edges of the output signal of the programmable divider during one cycle of the reference frequency, and $\phi_{PN}[K]$ is the output value of the error normalization block.

In this embodiment, when the output value $\phi_P[K]$ of the phase detector 160 is positive, the output frequency of the DCO 110 increases. On the contrary, when the output value $\phi_P[K]$ of the phase detector 160 is negative, the output frequency of the DCO 110 decreases. Consequently, when the PLL is locked, the output value $\phi_P[K]$ of the phase detector 160 is 0.

The frequency synthesizer according to the embodiment of the present invention may further include a loop filter 170 between the phase detector 160 and the DCO 110.

The loop filter 170 may average the output values of the phase detector 160, and output the average value to the DCO 110. The loop filter 170 may be implemented with a low pass filter. The loop filter 170 may be used for ensuring the loop stability of the PLL in the frequency synthesizer.

Figure 2A:
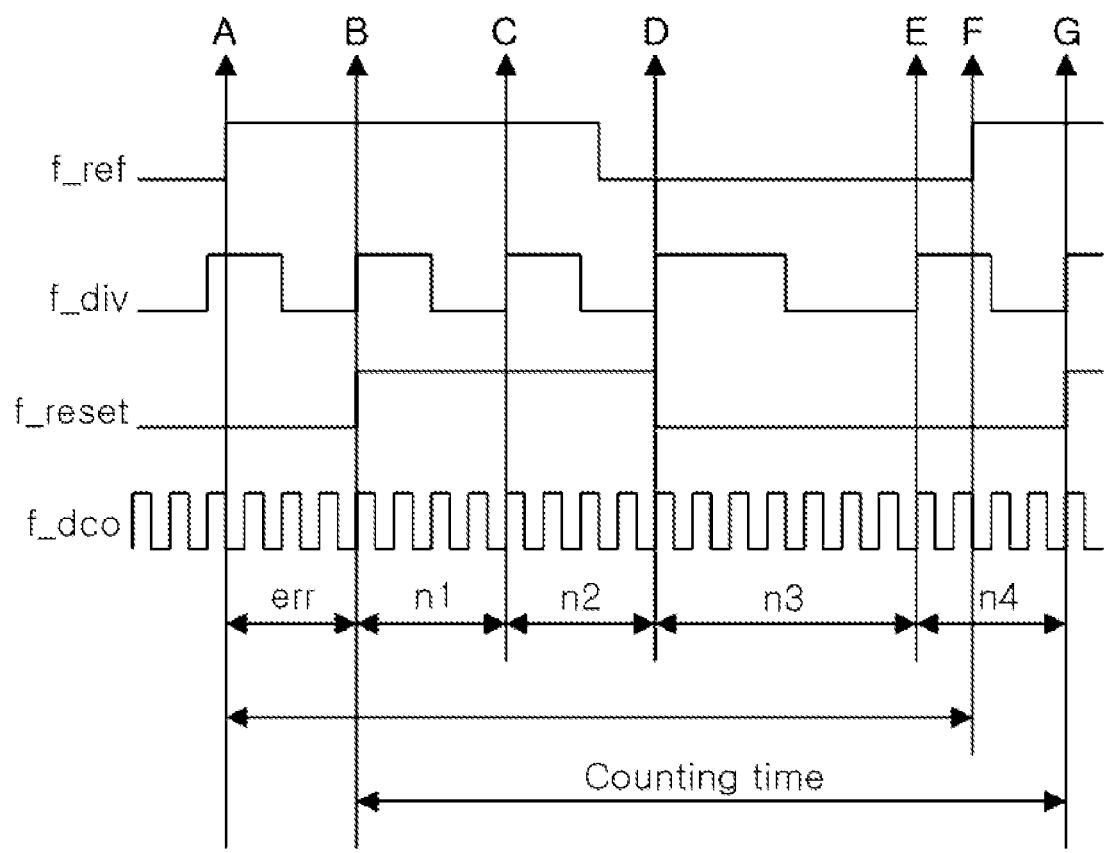
FIGS. 2A and 2B are the waveforms of signals in the frequency synthesizer of FIG. 1.
Figure 2B:
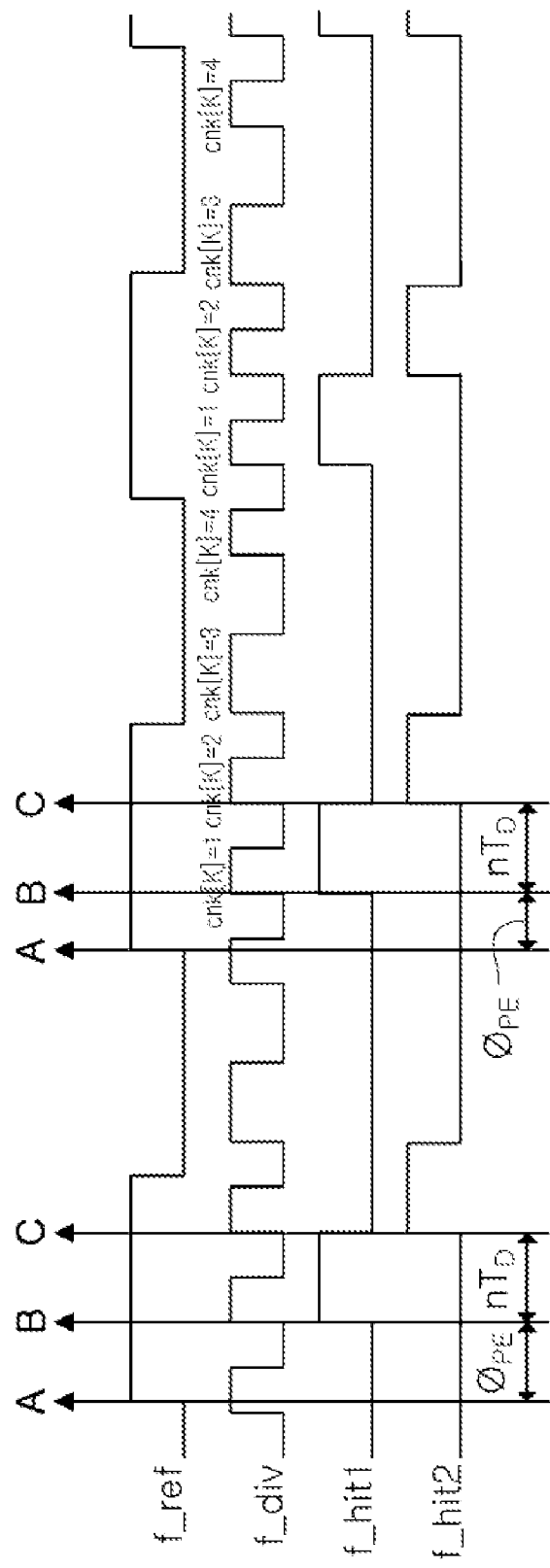

FIGS. 2A and 2B are waveforms of signals in the frequency synthesizer of FIG. 1.

Specifically, FIG. 2A is a waveform diagram of the reference frequency f_ref, the output frequency f_div of the programmable divider 120, the counter reset signal f_reset of the counter unit 130, and the output signal f_dco of the frequency oscillator 110 on time domain.

Referring to FIG. 2A, one cycle of the reference frequency f_ref is a section A-F. One cycle of the counter reset signal f_reset re-timed through the flip-flop 132 by using the output signal f_div of the programmable divider 120 as the clock signal is a section B-G. In the section B-G, the number of the rising edges of the output signal f_div of the programmable divider 120 may be counted by the counter 131, an the count value counted at the rising edge time of the reference frequency f$\phi_P[K]$ ref may be outputted as the count value cnk [K]. The count value cnk[K] outputted at the time F, which is the rising edge time of the reference frequency f_ref, is 4. Also, in the section B-G corresponding to one cycle of the counter reset signal f_reset, the output signal f_dco of the frequency oscillator 110 is divided by 4 three times n1, n2 and n4, and divided by 7 one time n3. Therefore, the minimum division ratio of the programmable divider 120 is 4, and the remainder c when the FCW command value is divided by the minimum division ratio is 3. The section A-B is a section representing a phase difference between the reference frequency f_ref and the reset signal f_reset.

FIG. 2B is a waveform diagram of the reference frequency f_ref, the output frequency f_div of the programmable divider 120, the first hit signal f_hit1 and the second hit signal f_hit2 outputted from the counter unit 130.

Referring to FIG. 2, the output signal f_div of the programmable divider 120 has four rising edges in one cycle of the reference frequency f_ref. The programmable divider 120 may divide the output signal f_dco of the frequency oscillator 110 by n+c only when the count value cnk[K] among the four rising edges is 3, and may divide the output signal f_dco of the frequency oscillator 110 by n when the count value cnk[K] is 1, 2, or 4. The first hit signal f_hit1 may have a high state only when the output signal f_div of the programmable divider 120 is inputted to the counter 131 and the count value cnk[K] is 1. The second hit signal f_hit2 may have a high state only when the output signal f_div of the programmable divider 120 is inputted to the counter 131 and the count value cnk[K] is 2.

The section A-B, from the rising edge of the reference frequency f_ref to the rising edge of the first hit signal f_hit1, is defined as $\phi_{PE}$, and it is a fractional error between the reference frequency f_ref and the output signal f_div of the programmable divider 120.

The section B-C, from the rising edge of the first hit signal f_hit1 to the rising edge of the second hit signal f_hit2, may have a time value of $n \times T_D$, where $T_D$ is one cycle of the output signal f_dco of the frequency oscillator 110.

Figure 3:
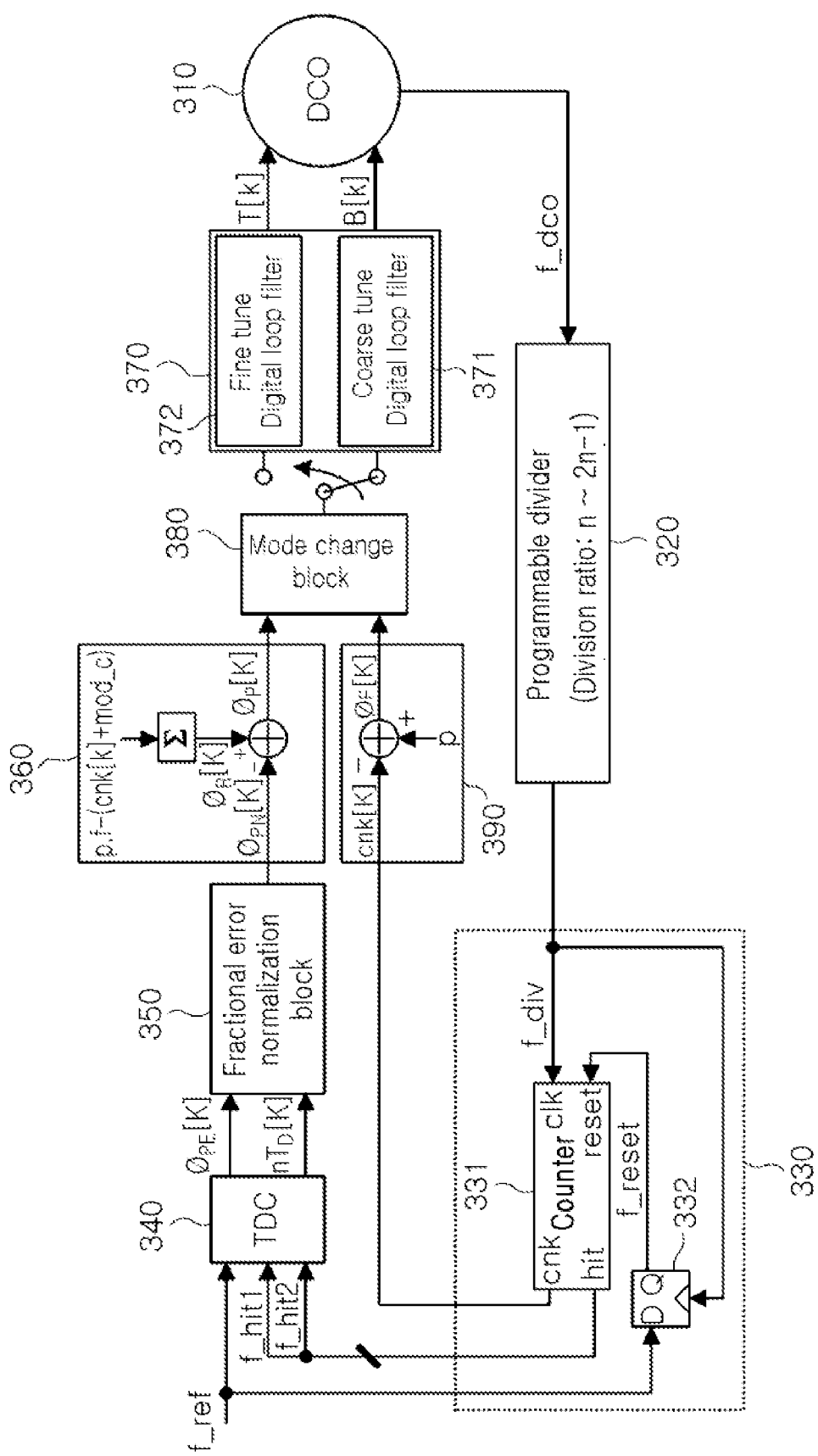
FIG. 3 is a configuration diagram of a frequency synthesizer according to another embodiment of the present invention.

FIG. 3 is a configuration diagram of a frequency synthesizer according to another embodiment of the present invention.

Referring to FIG. 3, the frequency synthesizer according to another embodiment of the present invention may include a frequency oscillator 310, a programmable divider 320, a counter unit 330, a time-to-digital converter 390, a fractional error normalization block 350, a phase detector 360, a loop filter unit 370, a mode change block 380, and a frequency detector 390.

In this embodiment, the frequency oscillator 310, the programmable divider 320, the counter unit 330, the frequency detector 390, the mode change block 380, and a first loop filter 371 of the loop filter unit 370 may configure a frequency correction loop. Also, the frequency oscillator 310, the programmable divider 320, the counter unit 330, the time-to-digital converter 390, the fractional error normalization block 350, the phase detector 360, the mode change block 380, and a second loop filter 372 of the loop filter unit 370 may configure a phase locked loop.

The frequency correction loop may shift the output frequency of the frequency oscillator 310 within a short time to an allowable error range that may be detected by the phase locked loop at a frequency desired by a user. The phase locked loop may lock from the frequency shifted by the frequency correction loop to the exact frequency desired by the user.

The operation of the frequency synthesizer according to the current embodiment of the present invention will be described below.

If the FCW command value is changed by the user, the mode change block 380 may recognize the change of the FCW command value and connect the frequency detector 390 to the first loop filter 371 in order to execute the frequency correction loop. The first loop filter 371 may be designed so that the loop filter 370 has a wide bandwidth in order for rapid locking of the frequency correction loop. The output bit value B[K] of the first loop filter 371 may be inputted to the frequency oscillator 310 to control the output frequency of the frequency oscillator 310.

The frequency oscillator 310 is an oscillator whose output frequency is controlled by digital input bits, and the frequency of the oscillation waveform may have linear characteristics with respect to the input control bits. The output signal f_dco of the frequency oscillator 310 may be inputted to the programmable divider 320.

The programmable divider 320 is a divider that may divide a frequency by an integer ranging from n to 2n−1. The programmable divider 320 may divide the output signal f_dco of the frequency oscillator 310 to output a division signal f_div. The division of the programmable divider 320 may be expressed as:

$$\text{floor}(FCW) = (p-1)n + (n+c)$$
$$= n \times p + c$$

FCW is a value inputted for obtaining an output frequency desired at the frequency oscillator 310. The FCW value may have an integer part and a fractional part, and floor(FCW) is the integer part of the FCW value. The value c represents the remainder when the integer part of the FCW value is divided by the minimum division ratio n.

That is, the programmable divider 320 may divide the output signal f_dco of the frequency oscillator 310 one time at the division ratio of n+c, and the others at the division ratio of n within one cycle of the reference frequency f_ref.

The counter unit 330 may include a counter 331 and a D flip-flop 332. The D flip-flop 332 of the counter unit 330 may receive the reference frequency f_ref at a D terminal, and use the output signal f_div of the programmable divider 320 as a clock to generate the reset signal f_reset corresponding to the re-timed reference frequency.

The counter 331 of the counter unit 330 may be reset at the rising edge time of the reset signal f_reset. The counter 331 may count the number of clocks of the output signal f_div of the programmable divider 320 within one cycle of the reset signal f_reset. The count value cnk[K] outputted from the counter 331 may be outputted to the frequency detector 390 at the rising edge time of the reference frequency f_ref. The count value cnk[K] may be obtained by counting the number of the rising edges of the output signal f_div of the programmable divider 320 within one cycle of the reference frequency f_ref.

The frequency detector 390 may compare the count value cnk[K] with the integer part p of the value obtained by dividing the integer part of the FCW value by the minimum division ratio n, and output the difference therebetween to the first loop filter 371. The frequency detector 390 may compare the integer part p and the count value cnk[K], and output a first control bit $\phi_F[K]$ corresponding to the difference between the integer value p and the count value cnk[K].

If the first control bit $\phi_F[K]$ is positive, a bit B[K] inputted to the frequency oscillator 310 through the loop filter 370 is readjusted as much as the positive value difference so that the output frequency of the frequency oscillator 310 increases. On the other hand, if the first control bit $\phi_F[K]$ is negative, the inputted bit B[K] is readjusted as much as the negative value difference so that the output frequency of the frequency oscillator 310 decreases. If the loop is repeated, the count value cnk[K] becomes equal to the integer value p, and the output value $\phi_F[K]$ of the frequency detector 310 becomes 0. Consequently, the output frequency of the frequency oscillator 310 may be locked.

The mode change block 380 may change the mode of the frequency synthesizer from the frequency correction loop to the phase locked loop. The mode change block 380 may count the number of successive 0s in the output value $\phi_F[K]$ of the frequency detector 390 at each clock of the reference frequency f_ref. The number $N\_{F0}$ of the successive 0s at each clock of the reference frequency may be calculated as follows:

$$N\_{F0} = n \times f\_ref / \Delta f$$

where $\Delta f$ represents the allowable error frequency range at which the phase locked loop is lockable,
f_ref represents the reference frequency, and
n represents the minimum division ratio of the programmable divider.

If the minimum division ratio is 4 and the allowable error frequency range $\Delta f$ is equal to the reference frequency, the output value $\phi_F[K]$ of the frequency detector 390 must have four successive 0s at each clock of the reference frequency f_ref in order for mode change. That the value p and the count value cnk[K] are equal to each other more than four times at the rising edge time of the reference frequency f_ref means that the section A-B of FIG. 2B is smaller than ¼ of the section n1, and the output frequency f_dco of the frequency oscillator 310 enters into the allowable error frequency range $\Delta f$.

The mode change block 380 may count the number of successive 0s in the output value of the frequency detector 390 in synchronization with the clock of the reference frequency f_ref, and may generate a signal for changing from the frequency correction loop to the phase locked loop when the count value cnk[K] becomes equal to the set value $N\_{F0}$.

When the mode change block 380 generates the signal for changing from the frequency correction loop to the phase locked loop, the frequency detector 390 may be disconnected from the first loop filter 371, and the phase detector 380 may be connected to the second loop filter 372. The second loop filter 372 may have a lower frequency resolution than the first loop filter 371.

The frequency oscillator 310 may receive the control bit outputted from the second loop filter 372 to generate the signal f_dco. The programmable divider 320 may output the division signal f_div by dividing the output signal f_dco of the frequency oscillator 310 one time at the division ratio of n+c and the others at the division ratio of n within one cycle of the reference frequency f_ref.

The counter unit 330 may count the number of the rising edge clocks of the output signal f_div of the programmable divider 320 during one cycle of the reference frequency f_ref, and output the count value cnk[K] at the rising edge time of the reference frequency f_ref. In addition, the D flip-flop 332 of the counter unit 330 may receive the reference frequency f_ref at the D terminal, and use the output signal f_div of the programmable divider 320 as a clock to generate the re-timed reset signal f_reset. The counter 331 reset at the rising edge of the reset signal f_reset may output the first hit signal f_hit1 when the count value cnk[K] is 1, and output the second hit signal f_hit2 when the count value cnk[K] is 2.

The time-to-digital converter 340 may receive the reference frequency f_ref, the first hit signal f_hit1, and the second hit signal f_hit2, convert the phase difference between the reference frequency f_ref and the first hit signal f_hit1 to output the first digital bit $\phi_{PE}[K]$, and convert the phase difference between the first hit signal f_hit1 and the second hit signal f_hit2 to output the second digital bit $nT_D$.

The fractional error normalization block 350 may receive the first digital bit $\phi_{PE}[K]$ and the second digital bit $nT_D[K]$ from the time-to-digital converter 340, and output a value $\phi_{PN}[K]$ obtained by dividing the first digital bit $\phi_{PE}[K]$ by the second digital bit $nT_D[K]$.

The phase detector 360 may receive the count value cnk[K] and the output value $\phi_{PN}[K]$ of the fractional error normalization block 350 to output a second control bit $\phi_P[K]$.

In this embodiment, the second control bit $\phi_P[K]$ outputted from the phase detector 360 may be expressed as:

$$\phi_P[K]=(\Sigma(p\cdot f-(cnk[K]+\text{mod\_}c)))-\phi_{PN}[K])$$

where p·f is a reference comparison value obtained by dividing the FCW command value by the minimum division ratio (where p is an integer value, and f is a fractional value), mod_c is a value obtained by dividing a value c by the minimum division ratio, wherein the value c is an integer value of the remainder when the FCW command value is divided by the minimum division ratio, cnk[K] is the count value obtained by counting the rising edges of the output signal of the programmable divider during one cycle of the reference frequency, and $\phi_{PN}[K]$ is the output value of the fractional error normalization block.

The output value $\phi_P[K]$ of the phase detector 360 may be averaged by the second loop filter 372 and control the output frequency of the frequency oscillator 310. When the output value $\phi_P[K]$ of the phase detector 360 is positive, the output frequency of the frequency oscillator 310 increases. Conversely, when the output value $\phi_P[K]$ of the phase detector 360 is negative, the output frequency of the frequency oscillator 310 decreases. Consequently, when the phase locked loop is locked, the output value $\phi_P[K]$ of the phase detector 360 becomes 0.

Figure 4:
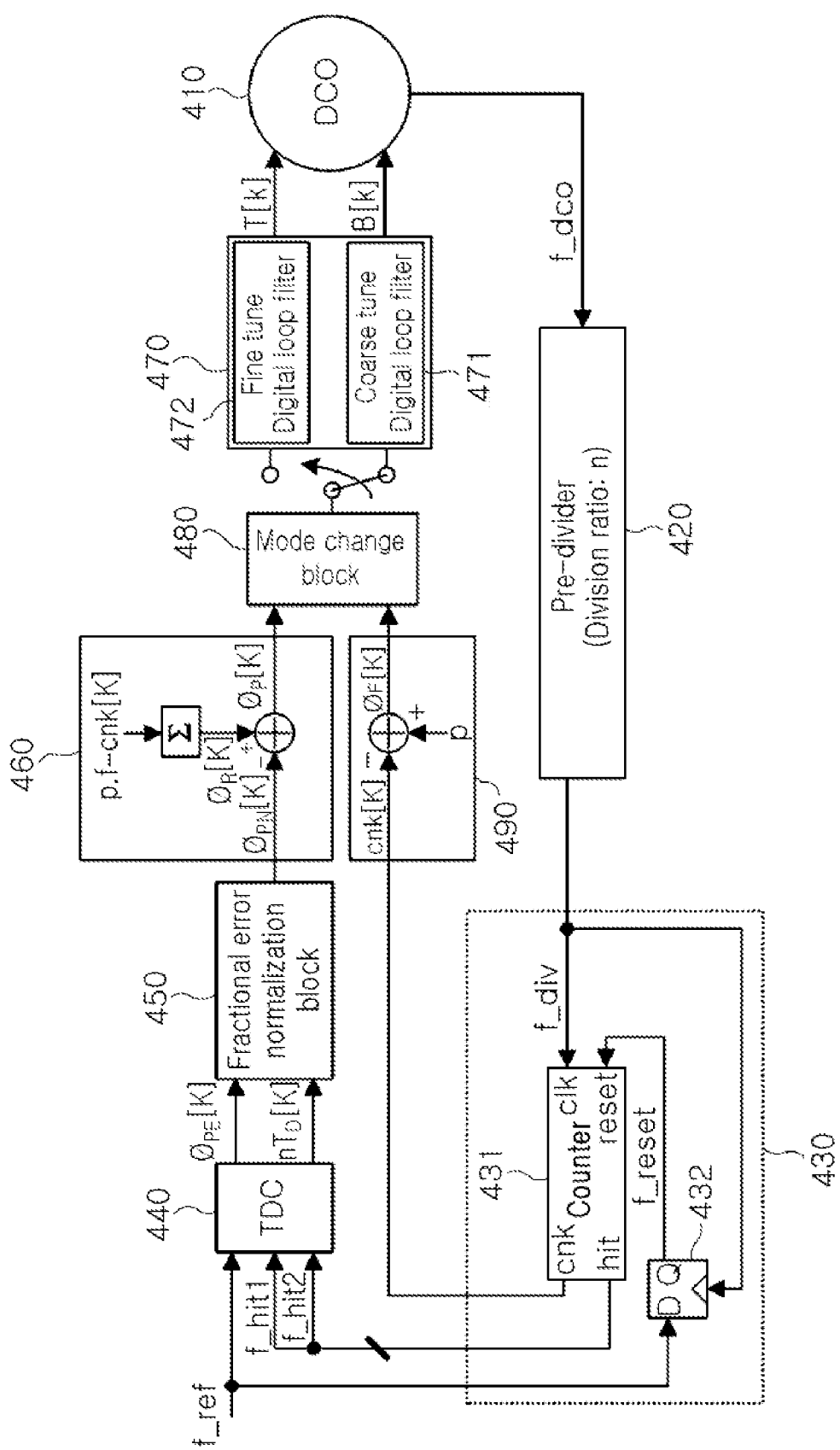
FIG. 4 is a configuration diagram of a frequency synthesizer according to another embodiment of the present invention.

FIG. 4 is a configuration diagram of a frequency synthesizer according to another embodiment of the present invention.

Referring to FIG. 4, the frequency synthesizer according to another embodiment of the present invention may include a frequency oscillator 910, a pre-divider 420, a counter unit 430, a time-to-digital converter 440, a fractional error normalization block 450, a phase detector 460, a loop filter unit 470, a mode change block 480, and a frequency detector 490.

In this embodiment, the frequency oscillator 410, the pre-divider 420, the counter unit 430, the frequency detector 490, the mode change block 480, and a first loop filter 471 of the loop filter unit 470 may be configured as a frequency correction loop. Also, the frequency oscillator 410, the pre-divider 420, the counter unit 430, the time-to-digital converter 440, the fractional error normalization block 450, the phase detector 460, the mode change block 480, and a second loop filter 472 of the loop filter unit 470 may be configured as a phase locked loop.

The frequency correction loop may shift the output frequency of the frequency oscillator 410 within a short time to an allowable error range that may be detected by the phase locked loop at a frequency desired by a user. The phase locked loop may lock from the frequency shifted by the frequency correction loop to the exact frequency desired by the user.

The operation of the frequency synthesizer according to the current embodiment of the present invention will be described below.

If the FCW command value is changed by the user, the mode change block 480 may recognize the change of the FCW command value and connect the frequency detector 490 to the first loop filter 471 in order to execute the frequency correction loop. The first loop filter 471 may be designed so that the loop filter 970 has a wide bandwidth in order for rapid locking of the frequency correction loop. The output bit value B[K] of the first loop filter 471 may be inputted to the frequency oscillator 410 to control the output frequency of the frequency oscillator 410.

The frequency oscillator 410 is an oscillator whose output frequency is controlled by digital input bits, and the frequency of the oscillation waveform may have linear characteristics with respect to the input control bits. The output signal f_dco of the frequency oscillator 410 may be inputted to the pre-divider 420.

The pre-divider 420 is a divider whose division ratio is fixed to an integer value n. The pre-divider 420 may receive the output signal f_dco of the frequency oscillator 410 to output a division signal f_div.

The counter unit 430 may include a counter 431 and a D flip-flop 432. The D flip-flop 432 of the counter unit 430 may receive the reference frequency f_ref at a D terminal, and use the output signal f_div of the pre-divider 420 as a clock to generate the reset signal f_reset corresponding to the re-timed reference frequency.

The counter 431 of the counter unit 430 may be reset at the rising edge time of the reset signal f_reset. The counter 431 may count the number of clocks of the output signal f_div of the pre-divider 420 within one cycle of the reset signal f_reset. The count value cnk[K] outputted from the counter 431 may be outputted to the frequency detector 490 at the rising edge time of the reference frequency f_ref. The count value cnk[K] may be obtained by counting the number of the rising edges of the output signal f_div of the pre-divider 420 within one cycle of the reference frequency f_ref.

The frequency detector 490 may compare the count value cnk[K] with the integer part p of the value obtained by dividing the integer part of the FCW value by the minimum division ratio n, and output the difference therebetween to the first loop filter 471. The frequency detector 490 may compare the integer part p and the count value cnk[K] and output a first control bit $\phi_F[K]$ corresponding to the difference between the integer value p and the count value cnk[K].

If the first control bit $\phi_F[K]$ is positive, a bit B[K] inputted to the frequency oscillator 410 through the loop filter 470 is readjusted by as much as the positive value difference, so that the output frequency of the frequency oscillator 410 is increased. On the other hand, if the first control bit $\phi_F[K]$ is negative, the inputted bit B[K] is readjusted by as much as the negative value difference, so that the output frequency of the frequency oscillator 410 is lowered. If the loop is repeated, the count value cnk[K] becomes equal to the integer value p, and the output value $\phi_F[K]$ of the frequency detector 410 becomes 0. Consequently, the output frequency of the frequency oscillator 410 may be locked.

The mode change block 480 may change the mode of the frequency synthesizer from the frequency correction loop to the phase locked loop. The mode change block 480 may count the number of successive 0s in the output value $\phi_F N$ of the frequency detector 490 at each clock of the reference frequency f_ref. The number $N\_F_0$ of the successive 0s at each clock of the reference frequency may be calculated as follows:

$$N\_F_0 = n \times f\_ref / \Delta f$$

where $\Delta f$ represents the allowable error frequency range at which the phase locked loop is lockable, f_ref represents the reference frequency, and n represents the minimum division ratio of the pre-divider.

If the minimum division ratio is 4 and the allowable error frequency range $\Delta f$ is equal to the reference frequency, the output value $\phi_F[K]$ of the frequency detector 490 must have four successive 0s at each clock of the reference frequency f_ref in order for mode change. That the value p and the count value cnk[K] are equal to each other more than four times at the rising edge time of the reference frequency f_ref means that the section A-B of FIG. 2B is smaller than ¼ of the section n1, and the output frequency f_dco of the frequency oscillator 410 enters into the allowable error frequency range Δf.

The mode change block 480 may count the number of successive 0s in the output value of the frequency detector 490 in synchronization with the clock of the reference frequency f_ref, and may generate a signal for changing from the frequency correction loop to the phase locked loop when the count value cnk[K] becomes equal to the set value N_$_{F0}$.

When the mode change block 480 generates the signal for changing from the frequency correction loop to the phase locked loop, the frequency detector 490 may be disconnected from the first loop filter 471, and the phase detector 480 may be connected to the second loop filter 472. The second loop filter 472 may have a lower frequency resolution than the first loop filter 471.

The frequency oscillator 410 may receive the control bit outputted from the second loop filter 472 to generate the signal f_dco. The pre-divider 420 may output the division signal f_div by dividing the output signal f_dco of the frequency oscillator 410 at the fixed division ratio of n.

The counter unit 430 may count the number of the rising edge clocks of the output signal f_div of the pre-divider 420 during one cycle of the reference frequency f_ref, and output the count value cnk[K] at the rising edge time of the reference frequency f_ref. In addition, the D flip-flop 432 of the counter unit 430 may receive the reference frequency f_ref at the D terminal, and use the output signal f_div of the pre-divider 420 as a clock to generate the re-timed reset signal f_reset. The counter 431 reset at the rising edge of the reset signal f_reset may output the first hit signal f_hit1 when the count value cnk[K] is 1, and output the second hit signal f_hit2 when the count value cnk[K] is 2.

The time-to-digital converter 440 may receive the reference frequency f_ref, the first hit signal f_hit1, and the second hit signal f_hit2, convert the phase difference between the reference frequency f_ref and the first hit signal f_hit1 to output the first digital bit $\phi_{PE}[K]$, and convert the phase difference between the first hit signal f_hit1 and the second hit signal f_hit2 to output the second digital bit $nT_D$.

The fractional error normalization block 450 may receive the first digital bit $\phi_{PE}[K]$ and the second digital bit $nT_D[K]$ from the time-to-digital converter 440, and output a value $\phi_{PN}[K]$ obtained by dividing the first digital bit $\phi_{PE}[K]$ by the second digital bit $nT_D[K]$.

The phase detector 460 may receive the count value cnk[K] and the output value $\phi_{PN}[K]$ of the fractional error normalization block 450 to output a second control bit $\phi_P[K]$. In this embodiment, the second control bit $\phi_P[K]$ outputted from the phase detector 460 may be expressed as:

$$\phi_P[K] = (\Sigma(p \cdot f - (cnk[K] + \mathrm{mod}\_c))) - \phi_{PN}[K])$$

where p·f is a reference comparison value obtained by dividing the FCW command value by the fixed division ratio n (where p is an integer value, and f is a fractional value), cnk[K] is the counter value obtained by counting the rising edges of the output signal of the pre-divider during one cycle of the reference frequency, and $\phi_{PN}[K]$ is the output value of the fractional error normalization block.

The output value $\phi_P[K]$ of the phase detector 460 may be averaged by the second loop filter 472 and control the output frequency of the frequency oscillator 410. When the output value $\phi_P[K]$ of the phase detector 460 is positive, the output frequency of the frequency oscillator 410 increases. On the contrary, when the output value $\phi_P[K]$ of the phase detector 460 is negative, the output frequency of the frequency oscillator 410 decreases. Consequently, when the phase locked loop is locked, the output value $\phi_P[K]$ of the phase detector 460 becomes 0.

As set forth above, according to exemplary embodiments of the invention, the frequency synthesizer may ensure the stability of the loop and shift the output frequency of the frequency oscillator to the desired frequency band within a short time.

While the present invention has been shown and described in connection with the exemplary embodiments, it will be apparent to those skilled in the art that modifications and variations can be made without departing from the spirit and scope of the invention as defined by the appended claims.

What is claimed is:

1. A frequency synthesizer comprising:
a frequency oscillator adjusting an output frequency according to a control bit;
a programmable divider having a minimum division ratio, the programming divider dividing the output frequency of the frequency oscillator at a variable division ratio;
a counter unit receiving an output signal of the programmable divider and a reference frequency to generate a count value by counting rising edges of the output signal of the programmable divider during one cycle of the reference frequency, and outputting a first hit signal when the count value is 1, and outputting a second hit signal when the count value is 2;
a frequency detector outputting a first control bit obtained by subtracting the count value of the counter unit from an integer value of a value obtained when a frequency channel word (FCW) command value is divided by the minimum division ratio, the FCW command value being a bit value inputted in order to obtain a desired output frequency;
a phase detection unit outputting a second control bit obtained by subtracting a fractional error of the output signal of the programmable divider from a fractional error at a locked phase obtained from the count value and the reference frequency;
a mode change block connected to the frequency detector and the phase detection unit to selectively output the first control bit or the second control bit; and
a loop filter unit connected between the mode change block and the frequency oscillator.

2. The frequency synthesizer of claim 1, wherein the phase detection unit comprises:
a time-to-digital converter converting a phase difference between the reference frequency and the first hit signal into a first digital bit, and converting a phase difference between the first hit signal and the second hit signal into a second digital bit;
an error normalization block outputting a value obtained when the first digital bit is divided by the second digital bit; and
a phase detector outputting the control bit obtained when an output value of the error normalization block is subtracted from the fractional error at the locked phase obtained from the count value and the reference frequency.

3. The frequency synthesizer of claim 2, wherein the control bit ($\phi_P[K]$) outputted from the phase detector is expressed as:

$$p \cdot f = FCW/n,$$

$$\mathrm{mod}_c = c/n,$$

$\Phi_P[K]=(\Sigma(p\cdot f-(cnk[K]+\mathrm{mod}_c)))-\Phi_{PN}[K]$ where FCW is a frequency channel word, n is the minimum division ratio, p·f is a reference comparison value (where p is an integer value, and f is a fractional value), c is a remainder value when the p is divided by the n, cnk[K] is the count value obtained by counting rising edges of the output signal of the programmable divider during one cycle of the reference frequency, and $\phi_{PN}$[K] is the output value of the error normalization block.

4. The frequency synthesizer of claim 1, wherein the mode change block counts number of successive 0s in the frequency detector output value in synchronization with reference frequency clocks, and changes a connection of the frequency detector and the loop filter unit to a connection of the phase detection unit and the loop filter unit when the count value is equal to a preset value, the preset value being a value obtained by multiplying the reference frequency (f_ref) by the minimum division ratio (n) and dividing a resulting value by an allowable error frequency (Δf) at which the phase locked loop is lockable.

5. The frequency synthesizer of claim 3, wherein the programmable divider divides the output signal of the frequency oscillator one time at a division ratio of n+c, and the others at a division ratio of n within one cycle of the reference frequency.

6. The frequency synthesizer of claim 1, wherein the counter unit comprises:
 a flip-flop receiving the reference frequency and the output signal of the programmable divider;
 a counter receiving an output signal of the flip-flop as a reset signal, and the output signal of the programmable divider as a clock signal; and
 a latch receiving the count value outputted from the counter and the reference frequency to output number of clocks.

7. The frequency synthesizer of claim 1, wherein the loop filter unit comprises:
 a first loop filter averaging first control bit values outputted from the frequency detector; and
 a second loop filter averaging second control bit values outputted from the phase detection unit.

* * * * *